(12) United States Patent
Loiseau

(10) Patent No.: US 7,253,396 B2
(45) Date of Patent: Aug. 7, 2007

(54) COOLED PHOTODETECTOR

(75) Inventor: Joseph Loiseau, Saint Maurice (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 10/499,960

(22) PCT Filed: Dec. 23, 2002

(86) PCT No.: PCT/FR02/04528

§ 371 (c)(1),
(2), (4) Date: May 2, 2005

(87) PCT Pub. No.: WO03/056632

PCT Pub. Date: Jul. 10, 2003

(65) Prior Publication Data
US 2005/0218316 A1 Oct. 6, 2005

(30) Foreign Application Priority Data
Dec. 26, 2001 (FR) .................... 01 16863

(51) Int. Cl.
H01J 7/24 (2006.01)
(52) U.S. Cl. ............... 250/238; 250/339.03; 62/259.2; 257/468
(58) Field of Classification Search ............... 250/238, 250/339.03, 352; 62/259.2; 257/468
See application file for complete search history.

(56) References Cited

U.S. PATENT DOCUMENTS

| 4,041,314 A | * | 8/1977 | Oppelt | 250/352 |
| 4,791,298 A | * | 12/1988 | Dunn et al. | 250/352 |
| 4,974,062 A | | 11/1990 | Maier et al. | |
| 4,995,236 A | | 2/1991 | Rouquier et al. | |
| 5,382,797 A | | 1/1995 | Kunimoto et al. | |
| 5,598,711 A | | 2/1997 | Stubbs | |
| 6,430,941 B1 | * | 8/2002 | Mordechai et al. | 62/51.2 |

FOREIGN PATENT DOCUMENTS

| EP | 0 213 421 A2 | 3/1987 |
| EP | 0 493 208 A1 | 7/1992 |

OTHER PUBLICATIONS

Patent Abstracts of Japan, "Cooling Type Infrared Ray Detector", Publication No. 63070127, Publication Date Mar. 30, 1988, Applicant NEC Corp.
International Search Report dated May 9, 2003.

* cited by examiner

Primary Examiner—Georgia Epps
Assistant Examiner—Stephen Yam
(74) Attorney, Agent, or Firm—Quarles & Brady LLP

(57) ABSTRACT

Cooled photosensitive cell (80) comprising a table (50), sensors (66) which are fitted on the table, a screen (80) to prevent parasitic radiation on the sensors, and at least one Joule-Thomson cooler (41, 42) to cool the table and the screen.

The table (50) and the screen (80) are cooled by convection, the table (50) being provided with apertures (55) for passage of the cooling flow, which communicate with an annular cavity (63) for cooling of the screen (80).

6 Claims, 3 Drawing Sheets

COOLED PHOTODETECTOR

The present invention relates to cooled photosensitive cells or quantal photosensitive cells.

Cooled photosensitive cells, or more briefly photosensitive cells, generally consist of sensors which are fitted on a cold table which is cooled by a cooler. More specifically, the table is at the end of a well of a cryostat.

Most highly sensitive photosensitive cells, typically those for gathering thermal images, for example infrared images, need to be cooled at a cryogenic temperature.

In the case of applications which require very rapid cooling, of approximately a few seconds, a cooler of the Joule-Thomson expansion type is used.

These coolers are in the form of a pipe coil which ends in a jet, and are supplied by a neutral gas under high pressure in order to eject from the coil a flow which, by means of isenthalpic expansion at the output from the jet, gives rise to cooling both of the table and of the pipe coil. As the expanded gas flows back on the pipe coil of the cooler, it therefore also cools the neutral gas which passes through the coil before being ejected by the jet, and so on until liquefaction occurs at the output from the jet.

At the point of equilibrium between the two phases, i.e. liquid and gaseous, at the output from the jet, the minimal temperature is reached, the temperature to be reached determining the selection of the neutral gas.

However, this does not mean that the thermal equilibrium of the photosensitive cell is obtained. In fact, the cold table has thermal inertia which opposes this.

In addition, the sensors must be protected against parasitic radiation by means of a screen which is integral with the cold table and is also cooled, thus also having thermal inertia to be overcome.

Finally, the photosensitive cell assembly must be at a temperature which is sufficiently homogeneous to avoid detracting from the image captured.

Hitherto, mechanical devices have already been produced which make it possible both to improve the cooling of the cold table and to homogenise the temperature of the photosensitive cell.

These devices are described in FR2671230 and FR2671431. They propose cooling by conduction of the screen, which is integral with the cold table. Unfortunately these devices are no longer rapid enough when the number of sensors or photosites (bars or matrices) is increased. In fact, the dimension of the detector is greater, which increases correspondingly the thermal inertia and the heterogeneousness of the temperature.

The object of the present invention is to eliminate this disadvantage.

For this purpose, the invention relates to a cooled photosensitive cell comprising a cold table, sensors which are fitted on the table, a screen to prevent parasitic radiation on the sensors, and at least one Joule-Thomson cooler to cool the table and the screen, characterised in that the table and the screen are cooled by convection.

In addition to the thermal conduction between the table and the screen, which allows the screen to be cooled by conduction, but with trailing caused by the thermal inertia of the table, the screen is cooled by a gaseous flow parallel to that which cools the table, and therefore without trailing.

Advantageously, the photosensitive cell is designed such that the table and the screen are cooled simultaneously.

The gaseous flows are ejected simultaneously on the table and on the screen. The thermal trailing between the table and the screen is thus reduced.

Also advantageously, the photosensitive cell comprises only one cooler to cool both the table and the screen.

Part of the gaseous flow which cools the table is diverted in order to cool the screen at the same time.

In the preferred embodiment of the photosensitive cell according to the invention, the table is provided with apertures for passage of the cooling flow, which communicate with an annular cavity for cooling of the screen, and the cavity for cooling of the screen extends between two cylindrical envelopes which are secured to the table.

The invention will be better understood by means of the following description of several embodiments of the detector, provided with reference to the attached drawing, in which.

Figure 1:
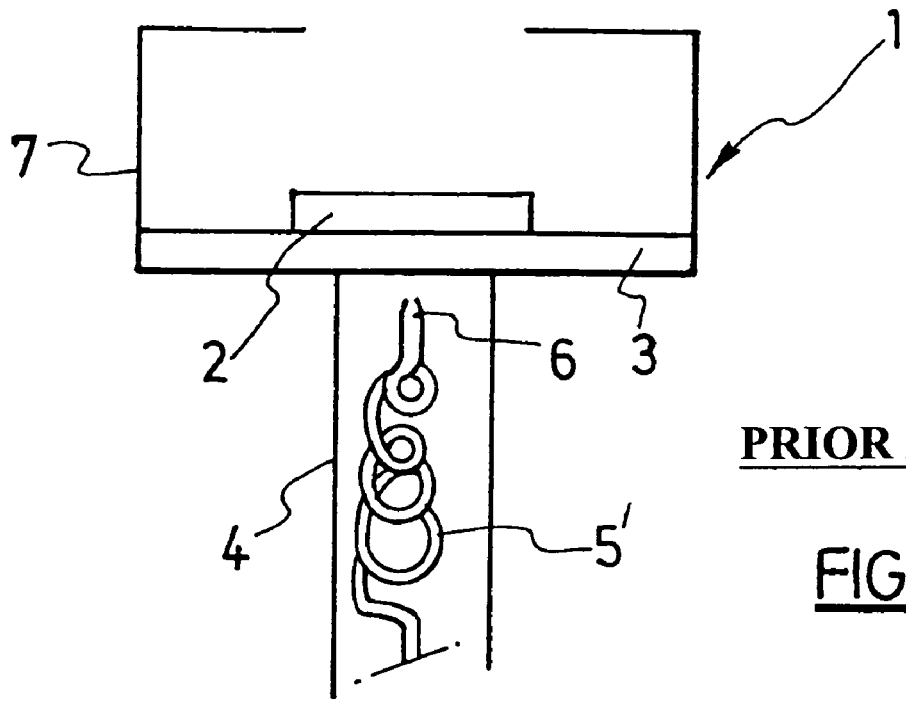
FIG. 1 is a schematic view of a detector according to the prior art.

With reference to FIG. 1, a photosensitive cell, or detector, 1, generally consists of sensors (photosensitive cells) 2 which are fitted on a cold table 3 cooled by a cooler, in this case a Joule-Thomson sensor which is fitted in a cryostat (cold finger) well 4, and consists of a pipe coil 5 which is supplied with neutral gas at a high pressure, and ends in a jet 6 from which this gas is ejected.

A screen 7 which is fitted, for example which is glued, onto the table 3, protects the sensors 2 against any parasitic radiation, when the operating temperature $\theta f$ is reached.

The assembly is isolated by vacuum or by a neutral gas in a cryostat, not shown.

Figure 2:
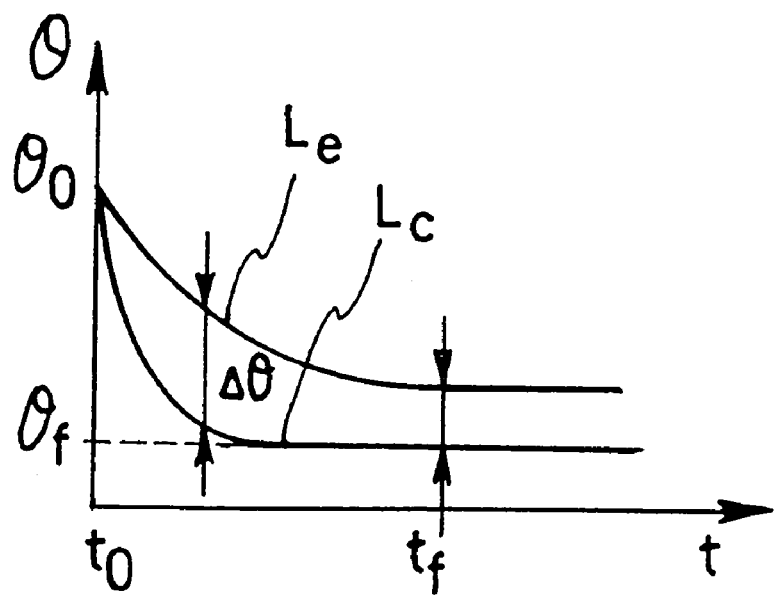
FIG. 2 shows the curves for lowering of the temperature of the table and screen of the detector in FIG. 1.

At the output from the jet 6, the gas expands in the cold finger 4 and is forced back by the cold table 3 onto the pipe coil 5, which it cools at the same time as the table, thus giving rise to progressive lowering of the temperature of the table to the temperature $\theta f$, according to a temporal law Lc which is represented qualitatively in FIG. 2.

Simultaneously, the screen 3, which is fitted integrally on the table, initially at the same temperature $\theta o$ as the table, cools more belatedly and more slowly according to a law Le, because of the fact that its cooling is assured by thermal conduction through the mass of the table, and therefore depends on its thermal inertia, which gives rise to thermal trailing $\Delta\theta$.

The effect of this thermal trailing, which admittedly decreases over a period of time, and even stabilises at $t_f$, therefore leads to a temperature difference between the table and the screen, which detracts from the thermal homogeneousness of the assembly during the time interval $t_f$-$t_o$. It is this time interval which the invention makes it possible to reduce.

Figure 3:
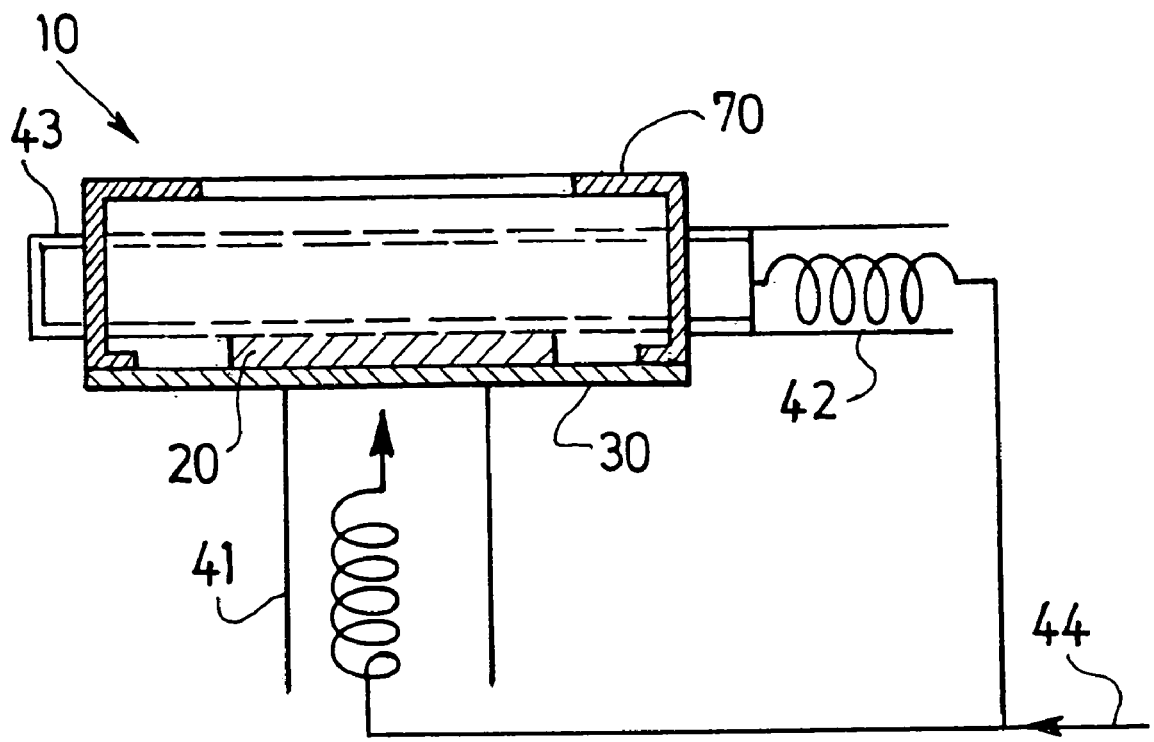
FIG. 3 is a schematic view in cross-section of a first embodiment of the detector according to the invention.

For this purpose, with reference to FIG. 3, it is proposed to cool the screen 70 at the same time as the table 30, by convection.

In this case, the detector 10 consists of sensors 20 which are fitted on the table 30 which is cooled by a cooler 41, and on which there is fitted a screen 70 which itself is cooled by a cooler 42 comprising an annular duct 43 around the screen 70 which channels the convection onto the screen.

Thus, the table and the screen are cooled simultaneously by the same means.

It will be noted that the wall of the duct 43 constitutes a cold wall, and the assembly is disposed inside an envelope with a hot wall comprising an input filter.

The supply to the coolers can be obtained from the same source 44, thus assuring better still the concomitance of the cooling of the table and of the screen.

Figure 5:
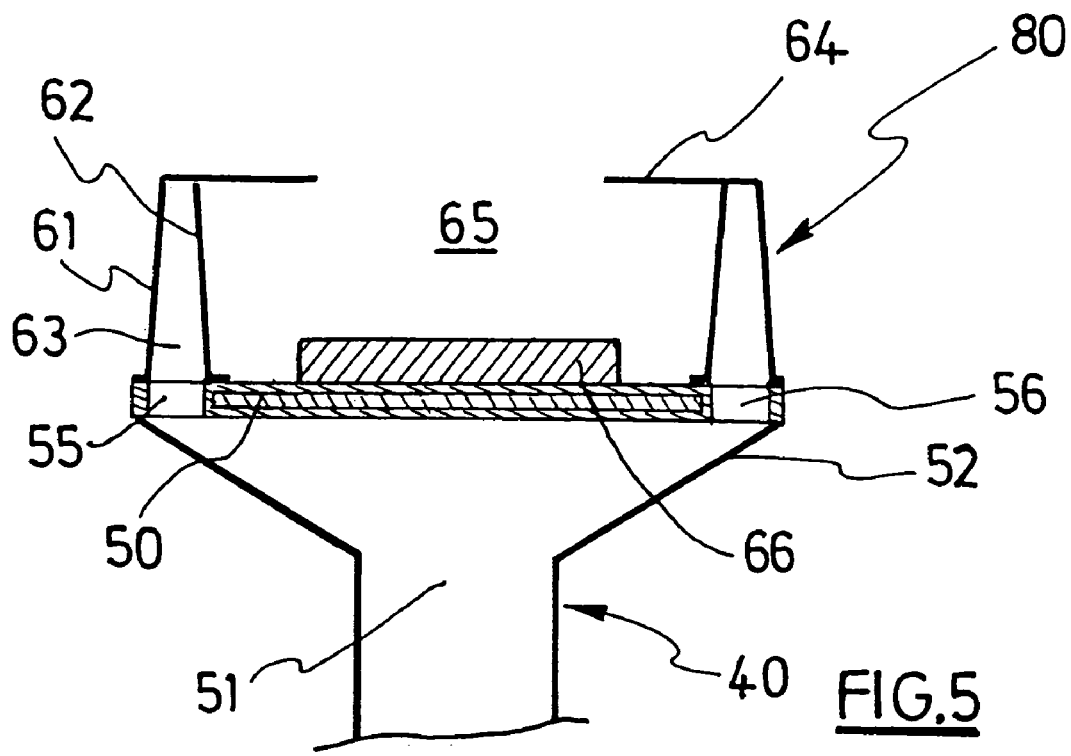
FIG. 5 is a schematic view in cross-section of a second embodiment of the detector according to the invention.
Figure 6:
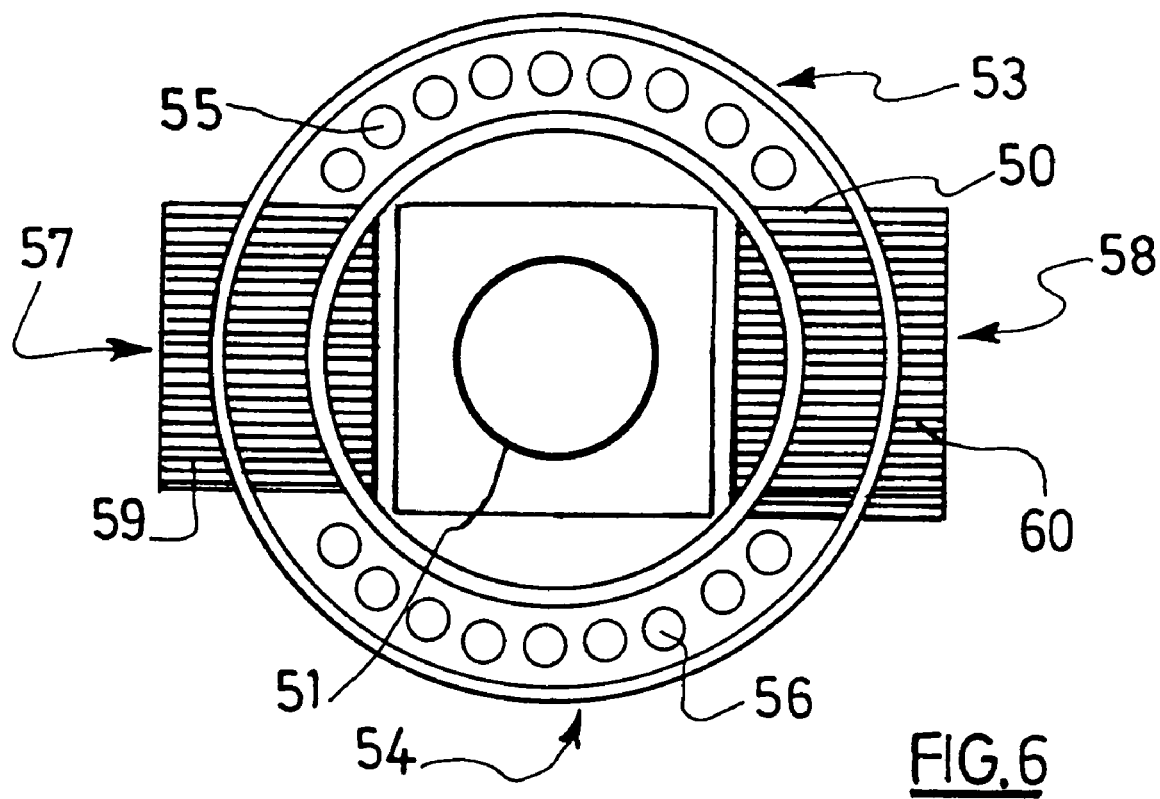
FIG. 6 is a schematic plan view of the detector in FIG. 5.

In the embodiment in FIGS. 5 and 6, the circular table 50, on which the sensors 66 are fitted, is cooled by a Joule-Thomson cooler 40 including a well 51 which is connected to the table by a frusto-conical portion 52. On two diametrically opposite peripheral sectors 53, 54, the table is provided with two pluralities of apertures or vents 55, 56 for passage of the cooling flow. It will be noted that the two sectors for passage of the convection flow are offset by 90 degrees relative to two other diametrically opposed sectors 57, 58, by means of which there extend tracks 59, 60 for electrical outputs of the detector, disposed on an inner layer below the screen, and connected to image processing electronics. The screen 80 consists of a cylindrical envelope 61, 62 inside which there extends an annular cavity 63 which communicates with the passage apertures 55, 56. An annular flange 64 partially closes the space 65 inside the inner envelope 62 of the screen 80, the central opening in the flange being able to be closed by an optical filter. In this case, the two envelopes 61, 62 of the screen consist of a thin wall made of conductive metal (copper/nickel for example). The envelopes 61, 62 are in this case secured to the table 50 by being glued. In this case, the cold table 50 consists of several layers of highly conductive ceramic material, the coefficient of expansion of which is compatible with the detector.

Thus, via the passage apertures 55, 56, the cavity 63 in the screen 80 communicates with the expansion volume of the Joule-Thomson cooler 51, 52 beneath the cold table 50.

Thus, also, an expansion volume has been created which is distributed both to the end of the cooler 51, 52 and in the inner cavity 63 in the screen 80. This results in rapid and simultaneous homogenisation of the detector and of the screen.

Figure 4:
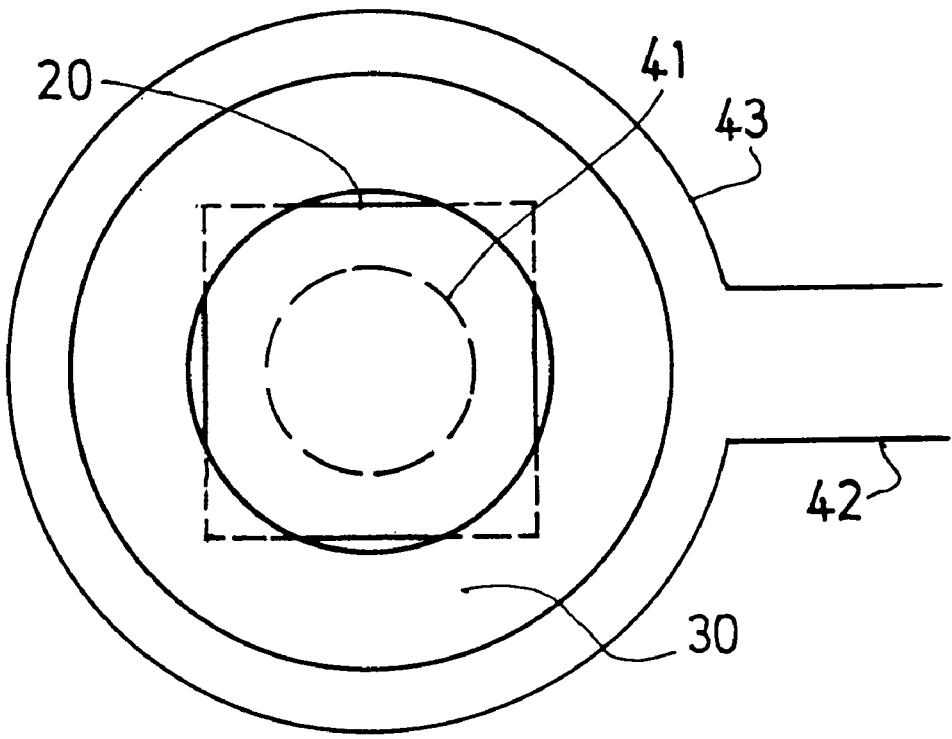
FIG. 4 is a schematic plan view of the detector in FIG. 3.

In the detector in FIGS. 3 and 4, the functions of cooling of the cold table and of the screen are dissociated, but with a common coolant gas source. If the gas supplies make it possible, two separate cryogenic lines can also be used, with a conventional Joule-Thomson cooler for cooling of the table and a second cooler for the screen.

Furthermore, and conversely, it could be conceived to cool the table and the screen by a single cryogenic line with a single cooler with a structure adapted accordingly.

With reference to FIGS. 5 and 6, it could be conceived for the cooling cavity to be integrated with the cold table and produced by machining. It is also conceivable for this cavity to be divided into two lobes. In this case, the electrical output tracks would then be connected separately to the exterior, as would the screen.

The invention claimed is:

1. Cooled photosensitive cell comprising a table having peripheral portions, sensors which are fitted on the table, a screen disposed on said peripheral portions and rising above the table to prevent parasitic radiation on the sensors, and a Joule-Thomson cooler to cool the table and the screen, characterised in that the table and the screen are cooled by convection by the single said cooler disposed below said table, and the table is provided with apertures in said peripheral portions for passage of the cooling flow, said apertures being positioned under an annular cavity in said screen and being in communication with said cavity for allowing said cooling flow to pass therethrough for cooling of the screen.

2. Photosensitive cell according to claim 1, wherein the cavity for cooling of the screen extends between two cylindrical envelopes which are secured to the table.

3. Photosensitive cell according to claim 1, wherein the table and the screen are cooled simultaneously.

4. Photosensitive cell according to claim 3, wherein the cavity for cooling of the screen extends between two cylindrical envelopes which are secured to the table.

5. Photosensitive cell according to claim 4, wherein the cooler comprises a well for cooling of the table, which is connected to the table by a frusto-conical portion.

6. Photosensitive cell according to claim 5, wherein the cooling cavity is integrated in the table and is produced by machining.

* * * * *